(12) United States Patent
Yu et al.

(10) Patent No.: US 10,854,577 B2
(45) Date of Patent: Dec. 1, 2020

(54) 3D DIE STACKING STRUCTURE WITH FINE PITCHES

(71) Applicant: Taiwan Semiconductor Manufacturing Company, Ltd., Hsinchu (TW)

(72) Inventors: Chen-Hua Yu, Hsinchu (TW); Chen-Shien Chen, Zhubei (TW); Shou-Cheng Hu, Tai-Chung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 21 days.

(21) Appl. No.: 16/221,819

(22) Filed: Dec. 17, 2018

(65) Prior Publication Data

US 2019/0123028 A1 Apr. 25, 2019

Related U.S. Application Data

(60) Continuation of application No. 15/191,838, filed on Jun. 24, 2016, now Pat. No. 10,157,884, which is a (Continued)

(51) Int. Cl.
*H01L 21/00* (2006.01)
*H01L 25/065* (2006.01)
(Continued)

(52) U.S. Cl.
CPC .......... *H01L 25/0657* (2013.01); *H01L 24/13* (2013.01); *H01L 24/14* (2013.01);
(Continued)

(58) Field of Classification Search
CPC ...... H01L 25/0657; H01L 25/50; H01L 24/13
See application file for complete search history.

(56) References Cited

U.S. PATENT DOCUMENTS

| 8,072,059 B2 * | 12/2011 | Shim | H01L 21/568 |
| | | | 257/698 |
| 8,466,543 B2 * | 6/2013 | Fleischman | H01L 24/06 |
| | | | 257/686 |

(Continued)

FOREIGN PATENT DOCUMENTS

| JP | 2015073107 A * | 4/2015 | .......... H01L 21/563 |
| JP | 2015073107 A | 4/2015 | |

(Continued)

*Primary Examiner* — Laura M Menz
(74) *Attorney, Agent, or Firm* — Slater Matsil, LLP

(57) ABSTRACT

A package includes package includes a first package component including a first plurality of electrical connectors at a top surface of the first package component, and a second plurality of electrical connectors longer than the first plurality of electrical connectors at the top surface of the first package component. A first device die is over the first package component and bonded to the first plurality of electrical connectors. A second package component is overlying the first package component and the first device die. The second package component includes a third plurality of electrical connectors at a bottom surface of the second package component. The third plurality of electrical connectors is bonded to the second plurality of electrical connectors. A fourth plurality of electrical connectors is at a bottom surface of the second package. The second and the fourth plurality of electrical connectors comprise non-solder metallic materials.

21 Claims, 5 Drawing Sheets

Related U.S. Application Data division of application No. 14/074,186, filed on Nov. 7, 2013, now Pat. No. 9,379,078.

(51) Int. Cl.
    *H01L 23/00* (2006.01)
    *H01L 25/00* (2006.01)
    *H01L 21/56* (2006.01)
    *H01L 23/31* (2006.01)

(52) U.S. Cl.
    CPC ............. *H01L 24/17* (2013.01); *H01L 24/81* (2013.01); *H01L 25/50* (2013.01); *H01L 21/563* (2013.01); *H01L 23/3128* (2013.01); *H01L 24/11* (2013.01); *H01L 24/16* (2013.01); *H01L 2224/1134* (2013.01); *H01L 2224/1147* (2013.01); *H01L 2224/11462* (2013.01); *H01L 2224/131* (2013.01); *H01L 2224/13017* (2013.01); *H01L 2224/13023* (2013.01); *H01L 2224/13124* (2013.01); *H01L 2224/13144* (2013.01); *H01L 2224/13147* (2013.01); *H01L 2224/13155* (2013.01); *H01L 2224/13164* (2013.01); *H01L 2224/1403* (2013.01); *H01L 2224/14051* (2013.01); *H01L 2224/16148* (2013.01); *H01L 2224/16238* (2013.01); *H01L 2224/1703* (2013.01); *H01L 2224/17051* (2013.01); *H01L 2224/32145* (2013.01); *H01L 2224/32225* (2013.01); *H01L 2224/73204* (2013.01); *H01L 2224/81815* (2013.01); *H01L 2224/831* (2013.01); *H01L 2225/06506* (2013.01); *H01L 2225/06513* (2013.01); *H01L 2225/06517* (2013.01); *H01L 2225/06555* (2013.01); *H01L 2225/06568* (2013.01); *H01L 2225/06582* (2013.01); *H01L 2225/06586* (2013.01); *H01L 2924/15311* (2013.01); *H01L 2924/181* (2013.01)

(56) References Cited

U.S. PATENT DOCUMENTS

| | | | |
|---|---|---|---|
| 8,742,597 B2 | 6/2014 | Nickerson et al. | |
| 8,878,353 B2 * | 11/2014 | Haba | H05K 1/11 257/686 |
| 9,263,394 B2 * | 2/2016 | Uzoh | H01L 21/76898 |
| 9,379,074 B2 * | 6/2016 | Uzoh | H01L 23/49811 |
| 9,379,078 B2 * | 6/2016 | Yu | H01L 24/13 |
| 9,496,152 B2 * | 11/2016 | Cho | H01L 21/568 |
| 9,583,456 B2 * | 2/2017 | Uzoh | H01L 28/20 |
| 9,653,433 B2 * | 5/2017 | Yu | H01L 21/31053 |
| 9,728,527 B2 * | 8/2017 | Uzoh | H01L 24/13 |
| 9,735,084 B2 * | 8/2017 | Katkar | H01L 23/36 |
| 9,812,402 B2 * | 11/2017 | Awujoola | H01L 24/48 |
| 10,115,678 B2 * | 10/2018 | Awujoola | H01L 24/49 |
| 10,157,884 B2 * | 12/2018 | Yu | H01L 25/0657 |
| 10,381,326 B2 * | 8/2019 | Woychik | H01L 21/6835 |
| 10,490,528 B2 * | 11/2019 | Prabhu | H01L 24/44 |
| 2009/0236752 A1 * | 9/2009 | Lee | H01L 24/97 257/777 |
| 2010/0246152 A1 * | 9/2010 | Lin | H01L 24/92 361/783 |
| 2012/0193785 A1 * | 8/2012 | Lin | H01L 24/97 257/737 |
| 2013/0001797 A1 * | 1/2013 | Choi | H01L 25/105 257/774 |
| 2013/0049224 A1 * | 2/2013 | Sutardja | H01L 27/108 257/774 |
| 2013/0187268 A1 * | 7/2013 | Lin | H01L 21/56 257/737 |
| 2013/0256914 A1 * | 10/2013 | Cheng | H01L 24/81 257/777 |
| 2013/0334692 A1 * | 12/2013 | Lim | H01L 24/81 257/766 |
| 2014/0035892 A1 * | 2/2014 | Shenoy | H01L 23/49827 345/205 |
| 2015/0076714 A1 * | 3/2015 | Haba | H01L 21/4846 257/784 |
| 2015/0123268 A1 * | 5/2015 | Yu | H01L 25/0657 257/737 |
| 2015/0187743 A1 * | 7/2015 | Yu | H01L 21/568 257/741 |
| 2015/0206848 A1 * | 7/2015 | Boja | H01L 23/5384 257/774 |
| 2015/0206865 A1 * | 7/2015 | Yu | H01L 24/17 257/737 |
| 2015/0235934 A1 * | 8/2015 | Wu | H01L 23/49894 257/777 |
| 2015/0235936 A1 * | 8/2015 | Yu | H01L 24/97 257/738 |
| 2015/0235989 A1 * | 8/2015 | Yu | H01L 23/5385 257/712 |
| 2015/0318263 A1 * | 11/2015 | Yu | H01L 24/92 257/774 |
| 2015/0318267 A1 * | 11/2015 | Yu | H01L 21/0214 257/774 |
| 2015/0357309 A1 * | 12/2015 | Liu | H01L 25/50 257/692 |
| 2016/0079222 A1 * | 3/2016 | Sato | H01L 24/17 257/738 |
| 2016/0307876 A1 * | 10/2016 | Yu | H01L 25/0657 |
| 2019/0123028 A1 * | 4/2019 | Yu | H01L 24/13 |

FOREIGN PATENT DOCUMENTS

| | | | | |
|---|---|---|---|---|
| WO | | 2015183742 A1 | 12/2015 | |
| WO | WO-2015183742 A1 * | 12/2015 | ............. H01L 24/13 |

\* cited by examiner

3D DIE STACKING STRUCTURE WITH FINE PITCHES

PRIORITY CLAIM AND CROSS-REFERENCE

This application is a continuation of U.S. patent application Ser. No. 15/191,838, entitled "3D Die Stacking Structure with Fine Pitches," filed on Jun. 24, 2016, which is a divisional of U.S. patent application Ser. No. 14/074,186, entitled "3D Die Stacking Structure with Fine Pitches," filed on Nov. 7, 2013, now U.S. Pat. No. 9,379,078 issued Jun. 28, 2016, which applications are incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O connections packed into smaller areas, and the density of the I/O connections rises quickly over time. As a result, the packaging of the semiconductor dies becomes more difficult, which adversely affects the yield of the packaging.

The increase in the density of the I/O connections results in the reduction in the pitch of the IO connections. As a result, the closely located solder regions, which are used to form the IO connections in the bonding processes, are more likely to bridge with each other.

One of the methods for packaging integrated circuits is die stacking, which is also sometimes referred to as three-dimensional (3D) die stacking. 3D Die stacking structures have reduced footages than the packages in which dies are disposed on the same plane. For example, in a conventional package, a first die is bonded to a second die through-flip chip bonding, wherein the second die has a larger area than the first die. The second die includes additional bond pads on the same side as the first die, which additional bond pads are not used for bonding to the first die. A third die is then bonded to the second die through flip-chip bonding, wherein the third die is bonded to the additional bond pads on the second die.

The third die has an area larger than the areas of both the first die and the second die. The third die, in addition to the bond pads that are used to bond to the second die, also includes extra bond pads that are on the same side (of the third die) as the first die and the second die. The third die may then be bonded to a package substrate through the extra bond pads.

In the above-discussed package, the first die and the second die have a first distance. The second die and the third die have a second distance greater than the first distance. The third die and the package substrate have a third distance greater than the second distance. Accordingly, the solder balls that are used to bond the third die to the second die are larger than the solder balls that are used to bond the first die to the second die. The solder balls that are used to bond the package substrate to the third die are larger than the solder balls that are used to bond the third die to the second die. The increase in the sizes of the solder balls causes the increase in the required size of the third die and the package substrate. In addition, the increase in the sizes of the solder balls also results in the increase in the pitches of the solder balls.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1:
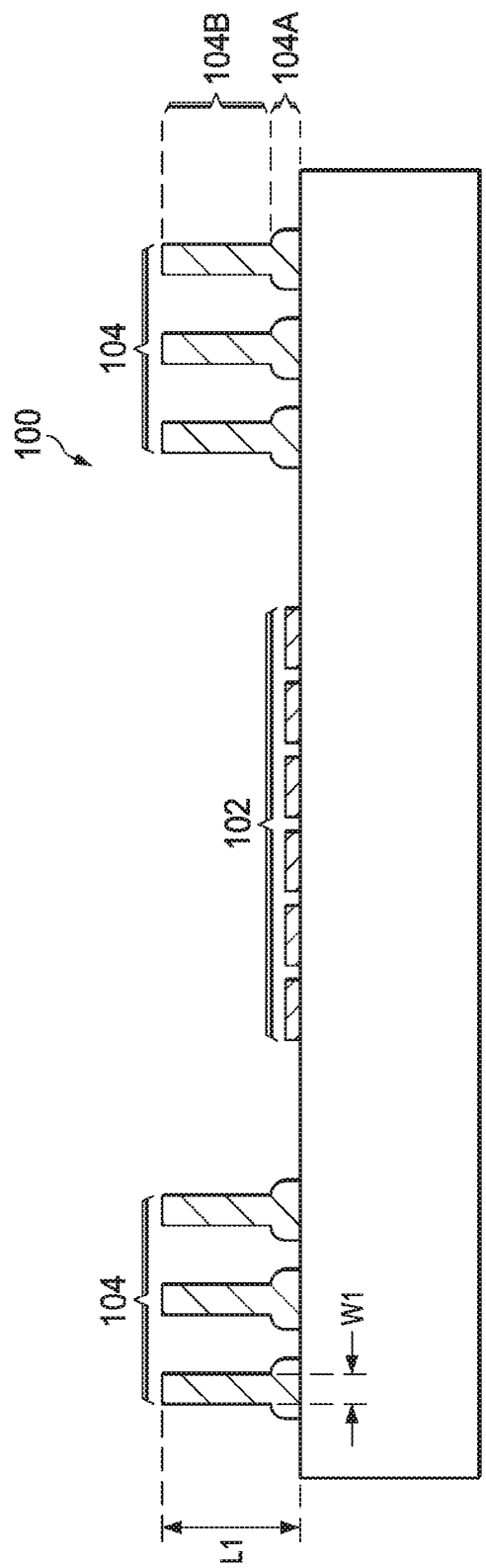
FIGS. 1 through 8 are cross-sectional views of intermediate stages in the manufacturing of a package in accordance with some exemplary embodiments, wherein elongated metal bumps are used for bonding.

FIGS. 1 through 8 illustrate the cross-sectional views of intermediate stages in the manufacturing of a package in accordance with some embodiments. Referring to FIG. 1, package component 100 is formed. In some embodiments, package component 100 is a device die, which includes active devices (not shown) such as transistors therein. Passive devices (not shown) such as capacitors, resistors, inductors, transformers, and the like, may also be built in package component 100. In alternative embodiments, package component 100 may be a package that includes a device and an interposer, a package substrate, or the like, wherein the interposer and the package substrate include electrical connections interconnecting the opposite sides, and may not include active devices therein. Throughout the description, package component 100 is referred to as device die 100 hereinafter. In some exemplary embodiments, device die 100 is an Application Specific Integrated Circuit (ASIC) die, a memory die, a logic die, or the like.

On the top surface of device die 100 reside electrical connectors 102 and 104. In some embodiments, electrical connectors 102 comprise metal pads, metal pillars (which may comprise copper, nickel, gold, or composite layers thereof), metal pillars with pre-solder layers, or the like. Electrical connectors 102 and 104 are electrically connected to the metal connections and active devices (not shown) in device die 100. Electrical connectors 104 have heights greater than that of electrical connectors 102.

In some embodiments, electrical connectors 104 comprise stud bumps, which are formed by making wire bonding on the metal pads of device die 100, and cutting the bond wire with a portion of bond wire left attached to the respective bond ball. For example, in FIG. 1, electrical connectors 104 may include lower portion 104A and upper portion 104B, wherein lower portion 104A may be a bond ball formed in the wire bonding, and the upper portion 104B may be the remaining bond wire. Upper portion 104B may have a uniform width and a uniform shape that are uniform throughout the top part, the middle part, and the bottom part of upper portion 104B. In some embodiments, the ratio of the length L1 to the width W1 of electrical connectors 104 is greater than about 1 and about 10. For example, ration L1/W1 is greater than about 1, or greater than about 2. Hence, electrical connectors 104 may be elongated connectors. Electrical connectors 102 and 104 are formed of non-solder metallic materials that do not melt at the normal temperatures (for example, between about 220° C. and about 280° C.) that are used to reflow solder. In some exemplary embodiments, electrical connectors 104 comprise copper, aluminum, nickel, gold, palladium, or the like, and may have a composite structure including a plurality of layers.

In alternative embodiments, electrical connectors 104 are formed through electrical plating. In which embodiments, a sacrificial layer (not shown) is formed over device die 100. A plurality of openings is formed in the sacrificial layer to expose the underlying metal pads (which may form lower portions 104A) in device die 100. A plating step is then performed to plate electrical connectors 104. After the formation of electrical connectors 104, the sacrificial layer is then removed.

Figure 2:
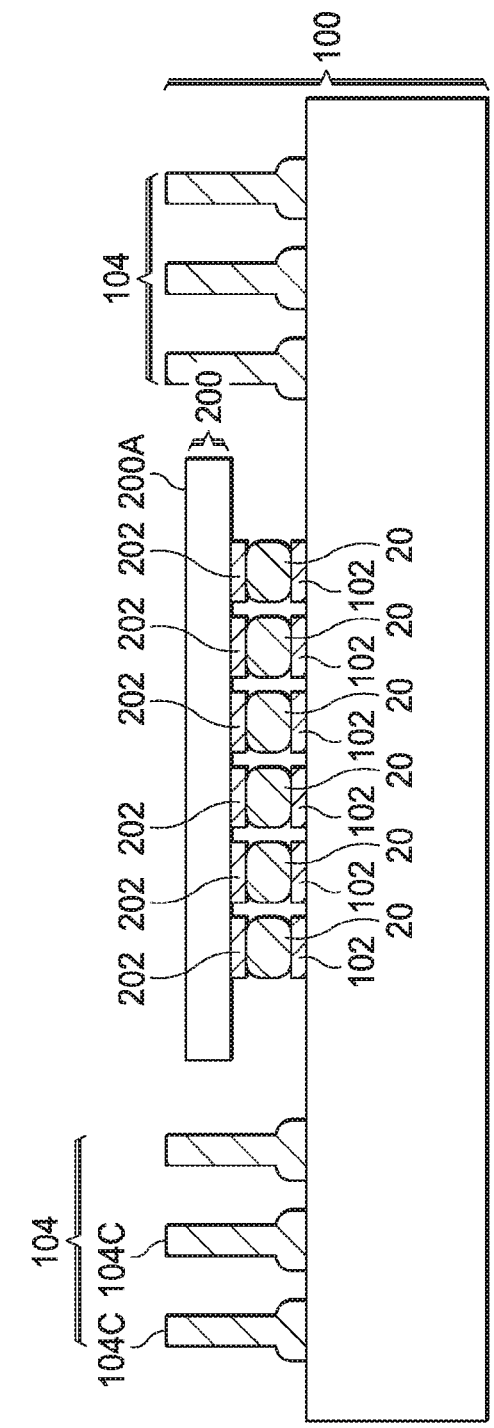

Referring to FIG. 2, package component 200 is bonded to device die 100 through flip chip bonding. Package component 200 may be a device die including active devices (not shown) therein. In some exemplary embodiments, package component 200 is a power management die, a logic die, a baseband die, or the like. Throughout the description, package component 200 is referred to device die 200. Device die 100 and device die 200 are bonded through solder regions 20, which are bonded between electrical connectors 102 of device die 100 and electrical connectors 202 of device die 200. Solder regions 20 may be solder balls that are attached to either or both of package components 100 and 200 before the bonding is performed. Throughout the description, each of solder regions 20 in combination with the overlying electrical connector 202 and the underlying electrical connector 102 is referred to as a bond structure. In some embodiments, electrical connectors 202 comprise metal pads, metal pillars (which may comprise copper, nickel, gold, or composite layers thereof), metal pillars with pre-solder layers, or the like.

In some embodiments, the top ends 104C of electrical connectors 104 are higher than the back surface 200A of die 200. In alternative embodiments, the top ends 104C of electrical connectors 104 are substantially level with the back surface 200A of die 200. No electrical connectors are formed on back surface 200A in some embodiments. The length of electrical connectors 104 may be equal to or greater than the combined thickness of die 200, solder regions 20, and possibly electrical connectors 102.

Figure 3:
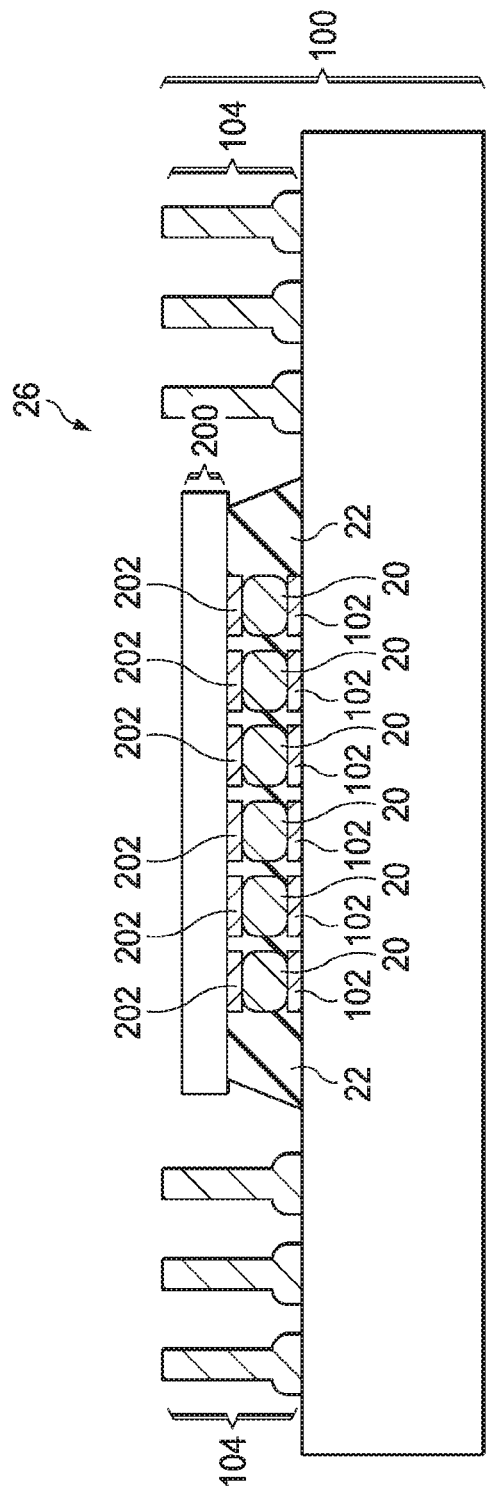

Referring to FIG. 3, underfill 22 is dispensed into the gap between device die 100 and device die 200 in order to protect the bonding of device dies 100 and 200. Underfill 22 is then cured. In the resulting structure, electrical connectors 104 may be aligned as a ring(s) (viewed from the top view of FIG. 3) encircling device die 100. Throughout the description, the structure in FIG. 3 is referred to as package 26.

Figure 4:
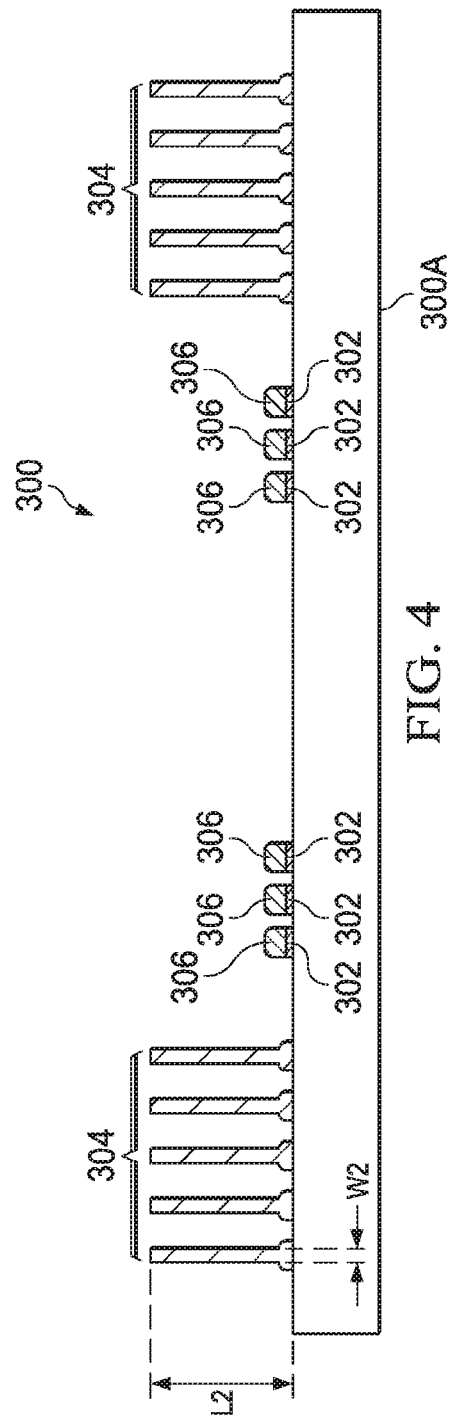

FIG. 4 illustrates package component 300. In some embodiments, package component 300 is a device die, which includes active devices (not shown) such as transistors therein. Passive devices (not shown) such as capacitors, resistors, transformers, and the like, may also be built in package component 300. In alternative embodiments, package component 300 is an interposer, a package substrate, or the like, which do not include active devices therein. Throughout the description, package component 300 is referred to as device die 300 hereinafter, although it may also be of other types. In some exemplary embodiments, device die 300 is a logic die, a baseband die, a memory die, or the like.

Electrical connectors 302 and 304 are formed at the top surface of device die 300. In some embodiments, electrical connectors 302 comprise metal pads, metal pillars (which may comprise copper, nickel, gold, or composite layers thereof), metal pillars with pre-solder layers, or the like. Electrical connectors 302 and 304 are electrically connected to the metal connections and active devices (not shown) in device die 300. Solder layers 306, which are sometimes referred to as pre-solder layers, are formed on electrical connectors 302.

Electrical connectors 304 are elongated connectors having heights greater than that of electrical connectors 302. Electrical connectors 304 may be formed using essentially the same candidate methods that are used for forming electrical connectors 104. For example, electrical connectors 304 may be stud bumps formed through wire bonding. In alternative embodiments, electrical connectors 304 are formed through electrical plating. In some embodiments, the ratio of the length to the width of electrical connectors 304 is greater than about 4 and about 16. Electrical connectors 302 and 304 are also formed of non-solder metallic materials that do not melt at the normal temperatures (for example, between about 220° C. and about 280° C.) that are used to reflow solder. In some exemplary embodiments, electrical connectors 304 comprise copper, aluminum, nickel, gold, palladium, or the like, and may have a composite structure including a plurality of layers.

In some embodiments, back surface 300A of device die 300 does not have any electrical connectors formed thereon. In alternative embodiments, device die 300 includes backside electrical connectors (such as metal pads, metal pillars, or solder layers) at back surface 300A, which backside electrical connectors are electrically connected to electrical connectors 302 and/or 304.

Figure 5:
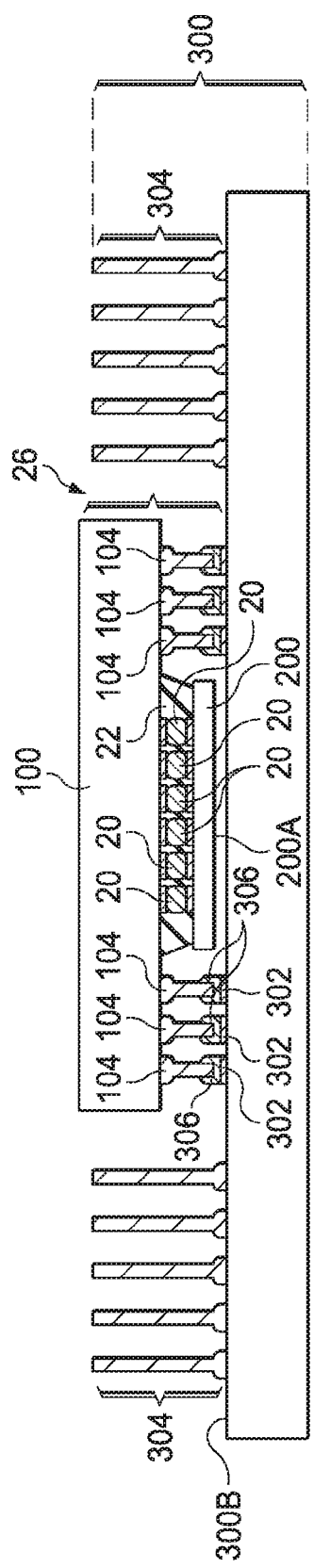

FIG. 5 illustrates the bonding of package 26 to device die 300. Electrical connectors 104 are bonded to electrical connectors 302 through solder regions 306. Hence, the circuits in devices 100 and 200 are electrically connected to the circuits in device die 300. Throughout the description, each of solder regions 306 in combination with the overlying electrical connector 104 and the underlying electrical connector 302 is referred to as a bond structure. In some embodiments, surface 200A of device die 200 is in physical contact with the top surface 300B of device die 300. In alternative embodiments, surface 200A of device die 200 is spaced apart from surface 300B of device die 300. In these embodiments, device dies 100 and 200 may be suspended through the support of electrical connectors 304.

Figure 6:
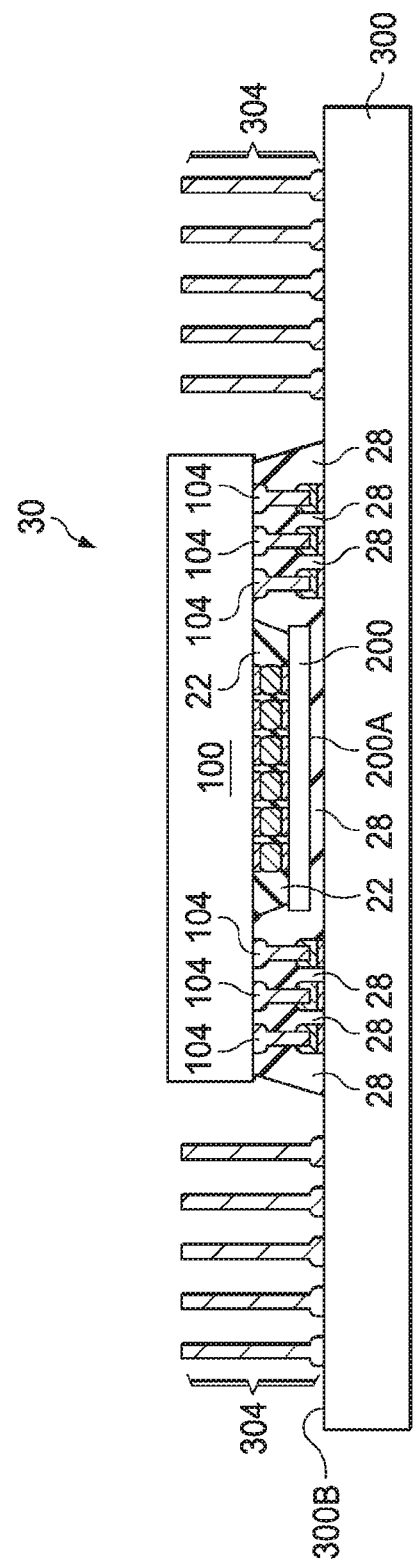

Referring to FIG. 6, underfill 28 is dispensed into the gap between device die 100 and device die 300 in order to protect the bonding between device dies 100 and 300. Underfill 28 is then cured. In the embodiments in which surface 200A of device die 200 is spaced apart from top surface 300B of device die 300, underfill 28 may be filled into the gap between device dies 200 and 300. Alternatively, an air gap may be formed between device dies 200 and 300, which air gap is encircled by underfill 28. Throughout the description, the package shown in FIG. 6 is referred to as package 30.

Figure 7:
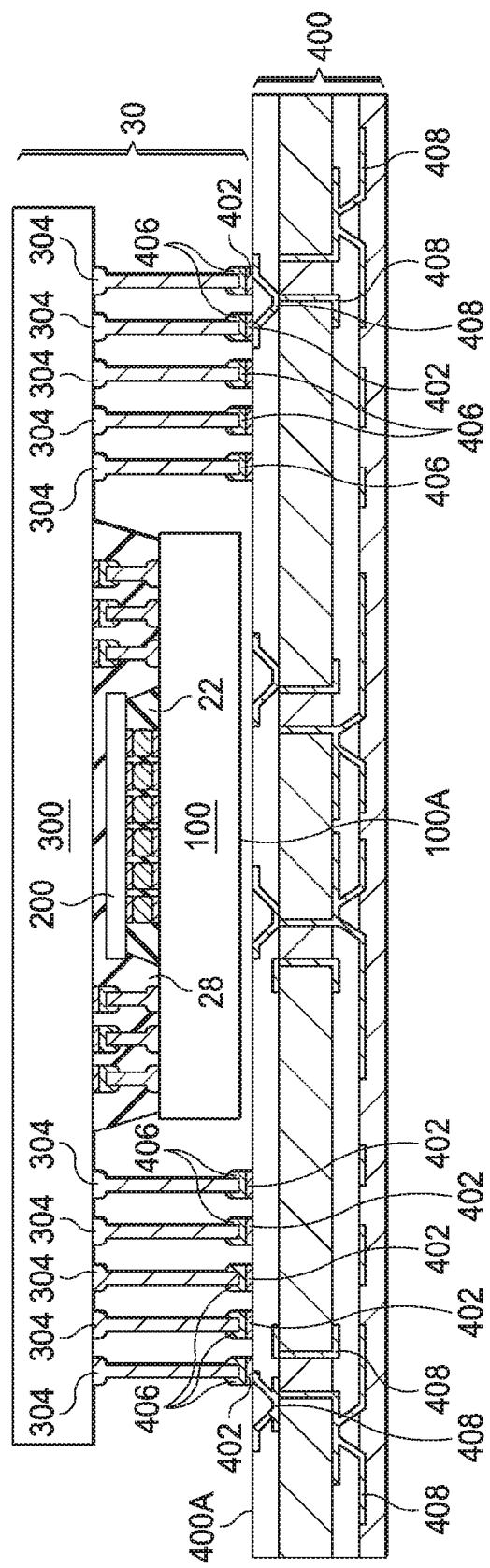

FIG. 7 illustrates the bonding of the package 30 with package substrate 400. Electrical connectors 304 are bonded to electrical connectors 402 through solder regions 406, which may be pre-formed on package substrate 400 before the bonding. Hence, the circuits in devices 100, 200, and 300 are electrically connected to the metal traces 408 in package substrate 400. Throughout the description, each of solder regions 406 in combination with the overlying electrical connector 304 and the underlying electrical connector 402 is referred to as a bond structure. In some embodiments, surface 100A of device die 100 is in physical contact with the top surface 400A of package substrate 400. In alternative embodiments, surface 100A of device die 100 is spaced apart from top surface 400A of package substrate 400. In these embodiments, device dies 100 and 200 may be suspended through the support of electrical connectors 304.

Figure 8:
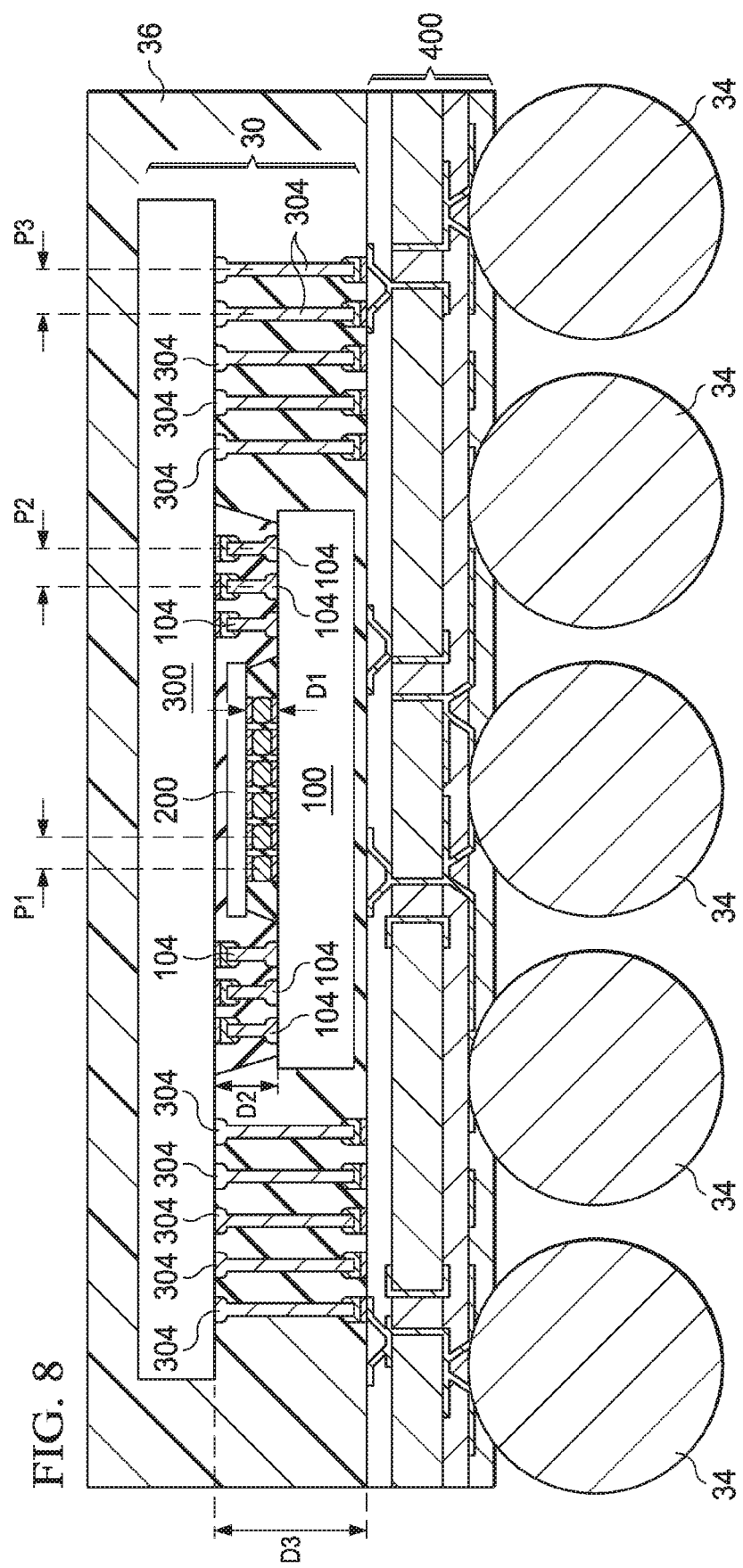

FIG. 8 illustrates the formation of solder balls 34 on package substrate 400. Through the internal metal traces and vias 408 in package substrate 400, solder balls 34 are electrically connected to electrical connectors 304. Furthermore, molding compound 36 is dispensed into the gap between package 30 and package substrate 400, so that the bond structures that bond package 30 to package substrate 400 are protected.

In some embodiments, pitch P1 of solder regions 204 is in the range between about 25 μm and about 100 μm. It is appreciated, however, that the values recited throughout the description are merely examples, and may be changed to different values. Pitch P2 of electrical connectors 104 may be in the range between about 40 μm and about 100 μm. Pitch P3 of electrical connectors 304 may be in the range between about 40 μm and about 200 μm. In some embodiments, pitch P3 is equal to, smaller than, or greater than pitch P2. Furthermore, pitch P2 may be equal to or smaller than pitch P1. In addition, there may exist the relationship P3≤P2≤P1.

Since the distance D1 between dies 100 and 200 is small, using solder region 20 to bond device dies 100 and 200 has an insignificant effect on the pitch P1, and hence solder regions 20 are used to reduce the manufacturing cost. On the other hand, the distance D2 between dies 200 and 300 and the distance D3 between die 300 and package substrate 400 have high values (and are greater than distance D1). As a result, if solder balls are used for the respective interconnection, the pitches of the bond structures are large. Using the elongated connectors 104 and 304 for the interconnection in the package thus has a significant effect on the reduction of pitches P2 and P3, respectively. Accordingly, in the embodiments of the present disclosure, a hybrid bond scheme is use in the package, in which solder regions 20 is mixed with elongated non-solder electrical connectors 104 and 304. The hybrid bond scheme results in the reduction of the footage of the resulting package without excessively increasing the manufacturing cost.

In accordance with some embodiments, a package includes a first package component including a first plurality of electrical connectors at a top surface of the first package component, and a second plurality of electrical connectors longer than the first plurality of electrical connectors at the top surface of the first package component. A first device die is over the first package component and bonded to the first plurality of electrical connectors, wherein the second plurality of electrical connectors has a length greater than a thickness of the first device die. A second package component is overlying the first package component and the first device die. The second package component includes a third plurality of electrical connectors at a bottom surface of the second package component. The third plurality of electrical connectors is bonded to the second plurality of electrical connectors. A fourth plurality of electrical connectors is at a bottom surface of the second package. The second and the fourth plurality of electrical connectors comprise non-solder metallic materials. A third package component is underlying the first package component. The third package component is bonded to the fourth plurality of electrical connectors. The fourth plurality of electrical connectors has a length greater than a sum of the thickness of the first device die and a thickness of the first package component.

In accordance with other embodiments, a package includes a first device die, and a second device die over the first device die and bonded to the first device die through first bond structures. The first bond structures have a first pitch. A third device die is overlying the first device die and the second device die. The third device die is bonded to the first device die through second bond structures, wherein the second bond structures have a second pitch. A package substrate is under the first device die, wherein the package substrate is bonded to the third device die through third bond structures. The third bond structures have a third pitch equal to or smaller than the second pitch.

In accordance with yet other embodiments, a method includes bonding a device die to first electrical connectors of a first package component, wherein the first electrical connectors are at a top surface of the first package component. A second package component is bonded to second electrical connectors of the first package component, wherein top ends of the second electrical connectors are level with or higher than a top surface of the device die. The second package component further includes third electrical connectors at a bottom surface, with bottom ends of the third electrical connectors level with or lower than a bottom surface of the first package component. The second electrical connectors and the third electrical connectors are formed of non-solder materials. A fourth package component is to the bottom ends of the third electrical connectors.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a package, the method comprising:

providing a first package component comprising metal pads;

forming first stud bumps on the first package component through wire bonding, wherein the first stud bumps and the metal pads are on a same side of the first package component;

forming a second package component comprising solder regions;

forming second stud bumps on the second package component, wherein the second stud bumps and the solder regions are on a same side of the second package component;
bonding a device die to the metal pads of the first package component, wherein the device die and the first package component form pails of a first package;
bonding the first package to the second package component to form a second package, wherein the first stud bumps are bonded to the solder regions; and
bonding the second package to a package substrate, with the second stud bumps bonded to the package substrate.

2. The method of claim 1, wherein the first stud bumps are distributed on opposite sides of the metal pads, and the first package component is wider than the device die.

3. The method of claim 1, wherein the second package component is wider than the first package, and after the first package is bonded to the second package component, the second stud bumps are distributed on opposite sides of the first package.

4. The method of claim 1, wherein the first stud bumps and the second stud bumps are formed by:
performing wire bonding processes on a respective one of the first package component and the second package component; and
cutting bond wires used in the wire bonding processes.

5. The method of claim 1, wherein the second stud bumps are bonded to additional solder regions of the package substrate.

6. The method of claim 1, wherein the device die and the second package component are not electrically connected directly, and the device die is electrically connected to the second package component through the first package component.

7. The method of claim 1, wherein the second stud bumps are longer than a combined thickness of the device die and the first package component.

8. The method of claim 1 further comprising:
dispensing a first underfill between the device die and the first package component; and
dispensing a second underfill between the first package and the second package component, wherein the second underfill contacts the first underfill.

9. The method of claim 1, wherein the first package component is between the device die and the package substrate, and the first package and the package substrate are on a same side of the second package component.

10. A method of forming a package, the method comprising:
providing a first package component comprising metal pads;
forming first stud bumps on the first package component through wire bonding, wherein the first stud bumps and the metal pads are on a same side of the first package component;
forming a second package component comprising solder regions;
forming second stud bumps on the second package component, wherein the second stud bumps and the solder regions are on a same side of the second package component;
bonding a device die to the metal pads of the first package component, wherein the device die and the first package component form pails of a first package;
bonding the first package to the second package component to form a second package, wherein the first stud bumps are bonded to the solder regions, wherein the device die is between the first package component and the second package component, and the first stud bumps are distributed to opposite sides of the device die; and
bonding the second package to a package substrate, with the second stud bumps bonded to the package substrate.

11. The method of claim 10, wherein the first package component extends beyond edges of the device die.

12. The method of claim 10, wherein the second package component extends beyond opposing edges of the first package, and after the first package is bonded to the second package component, the second stud bumps are distributed on opposite sides of the first package.

13. The method of claim 10, wherein the first stud bumps and the second stud bumps are formed by:
performing wire bonding processes on a respective one of the first package component and the second package component; and
cutting bond wires used in the wire bonding processes.

14. The method of claim 10, wherein a first height of the device die is smaller than a second height of the first stud bumps.

15. The method of claim 14, wherein both of the device die and the first package component are between the second package component and the package substrate.

16. The method of claim 10, wherein the second stud bumps are longer than a combined thickness of the device die and the first package component.

17. The method of claim 10 further comprising:
dispensing a first underfill between the device die and the first package component; and
dispensing a second underfill between the first package and the second package component, wherein the second underfill contacts the first underfill.

18. The method of claim 10, wherein the first package component is between the device die and the package substrate, and the first package and the package substrate are on a same side of the second package component.

19. A method of forming a package, the method comprising:
providing a first package component comprising metal pads;
forming first stud bumps on the first package component through wire bonding, wherein the first stud bumps and the metal pads are on a same side of the first package component;
forming a second package component comprising solder regions;
forming second stud bumps on the second package component, wherein the second stud bumps and the solder regions are on a same side of the second package component;
bonding a device die to the metal pads of the first package component, wherein the device die and the first package component form pails of a first package;
bonding the first package to the second package component to form a second package, wherein the first stud bumps are bonded to the solder regions, wherein the device die is spaced apart from the second package component by a first gap; and
bonding the second package to a package substrate, with the second stud bumps bonded to the package substrate, wherein the first package component is spaced apart from the package substrate by a second gap, and wherein the device die is between the first package component and the second package component, and both of the device die and the first package component are between the second package component and the package substrate.

20. The method of claim 19, wherein the forming the first stud bumps and the forming the second stud bumps comprise bonding bond wires and cutting bond wires.

21. The method of claim 19, wherein the device die and the second package component are electrically connected indirectly through the first package component and the first stud bumps.

* * * * *

UNITED STATES PATENT AND TRADEMARK OFFICE
CERTIFICATE OF CORRECTION

PATENT NO. : 10,854,577 B2  
APPLICATION NO. : 16/221819  
DATED : December 1, 2020  
INVENTOR(S) : Chen-Hua Yu Page 1 of 1

It is certified that error appears in the above-identified patent and that said Letters Patent is hereby corrected as shown below:

In the Claims

In Column 7, Line 7, Claim 1, delete "pails" and insert --parts--.

In Column 7, Line 64, Claim 10, delete "pails" and insert --parts--.

In Column 8, Line 56, Claim 19, delete "pails" and insert --parts--.

Signed and Sealed this  
Thirtieth Day of March, 2021

Drew Hirshfeld  
*Performing the Functions and Duties of the  
Under Secretary of Commerce for Intellectual Property and  
Director of the United States Patent and Trademark Office*